United States Patent [19]

Slotboom et al.

[11] Patent Number: 4,669,100

[45] Date of Patent: May 26, 1987

[54] CHARGE-COUPLED DEVICE HAVING A BUFFER ELECTRODE

[75] Inventors: Jan W. Slotboom; Hendrik A. Harwig; Marcellinus J. M. Pelgrom, all of Eindhoven, Netherlands

[73] Assignee: U.S. Philips Corporation, New York, N.Y.

[21] Appl. No.: 910,795

[22] Filed: Sep. 22, 1986

Related U.S. Application Data

[63] Continuation of Ser. No. 787,005, Oct. 10, 1985, abandoned, which is a continuation of Ser. No. 443,798, Nov. 22, 1982, abandoned.

[30] Foreign Application Priority Data

Nov. 30, 1981 [NL] Netherlands .................... 8105397

[51] Int. Cl.[4] ................... G11C 19/28; G11C 11/34; H01L 29/78
[52] U.S. Cl. ........................... 377/60; 377/62; 357/24; 365/183
[58] Field of Search .................. 357/24; 377/57–63; 365/183

[56] References Cited

U.S. PATENT DOCUMENTS

| 3,967,254 | 6/1976 | Kosonocky et al. | 357/24 |
| 4,211,936 | 7/1980 | Kosonocky et al. | 357/24 |
| 4,376,897 | 3/1983 | Byrne et al. | 357/24 |
| 4,493,060 | 1/1985 | Varshney | 365/183 |

FOREIGN PATENT DOCUMENTS

60198 9/1982 European Pat. Off. ............. 357/24

Primary Examiner—Gene M. Munson
Attorney, Agent, or Firm—Robert T. Mayer; Steven R. Biren

[57] ABSTRACT

A series-parallel-series memory or other parallel-to-series CCD has charge-signals interlaced in alternate parallel channels 1a and 1b, and de-interlacing electrodes (19, 20, 21, 22) at the parallel-to-series transition. In order to avoid delay effects as a result of comb-shaped electrode configurations of the de-interlacing electrodes, and associated complex clock control, a narrow extra electrode (41) is provided between the de-interlacing electrodes and the series-output register (B). This electrode (41) may serve as a buffer electrode for each half row of information (from 1a or 1b) while the preceding half row (from 1b or 1a) is transported through the series output register.

5 Claims, 6 Drawing Figures

CHARGE-COUPLED DEVICE HAVING A BUFFER ELECTRODE

This is a continuation of application Ser. No. 787,005, filed Oct. 10, 1985, which was a continuation of application Ser. No. 443,798 filed Nov. 22, 1982, both now abandoned.

BACKGROUND OF THE INVENTION

The invention relates to a charge-coupled device comprising at a surface of a semiconductor body a system of juxtaposed parallel channels and a series output register of which successive charge storage and transfer elements are each associated with a parallel channel, which system of parallel channels comprises two subgroups so arranged that the parallel channels belong alternately to a first and to a second sub-group, and in which there is provided at the area of transition from the parallel channels to the series output resistor an electrode system by means of which a row of charge packets transported through the parallel channels can be divided into two sub-rows which correspond to the two sub-groups and which can be introduced successively into the series output register, said electrode system comprising first and second comb-shaped electrodes and first and second strip-shaped control electrodes, the first comb-shaped electrode having a cross-bar in the form of a strip extending transversely across the parallel channels and having teeth which extend from the cross-bar in the direction of charge transport above the parallel channels of the first sub-group, the second comb-shaped electrode having a cross-bar which near the tips of the teeth of the first comb-shaped electrode extends transversely across the parallel channels and has teeth which are interdigitated with the teeth of the first comb-shaped electrode and extend above the parallel channels of the second sub-group into the proximity of the strip-shaped cross-bar of the first comb-shaped electrode, the first and second strip-shaped control electrodes extending transversely across the parallel channels and, viewed perpendicular to the surface, being present in the regions between the tips of the first comb-shaped electrode and the cross-bar of the second comb-shaped electrode, and in the regions between the tips of the second comb-shaped electrode and the cross-bar of the first comb-shaped electrode, respectively.

A known type of charge-coupled device having a system of parallel channels, the outputs of which are coupled to the parallel inputs of a series output register, is a series-parallel-series (SPS) memory. The parallel channels form a memory matrix for analog or digital information which is introduced via a series input channel and which can be read out via the series output channel. Another form of charge-coupled device of the above-described type is an image sensor in which the charge stored in the parallel section corresponds to a received two-dimensional radiation pattern. Although the invention can be used for such other forms of device and not merely in SPS-memories, it will nevertheless be described mainly with reference to SPS-memories due to the particular advantages for these important memory devices.

In conventional SPS-memories, the series channels are formed by 2-phase CCD's. Because in a 2-phase CCD one empty site must always occur per full charge storage site, it is apparent to choose the pitch between the parallel channels such that one parallel channel occurs in the series register per two charge storage transfer sites. Upon transferring a row of charge packets from the parallel section into the series channel, half of the storage sites in the series channels are occupied, so that the charge packets can be transported to the output in the usual manner.

A method of increasing the information density, known per se, for example, from U.S. Pat. No. 3,967,254, uses the principle of "interlacing" and "de-interlacing". The pitch between the parallel channels in comparison with the above-described construction may be chosen to be two times smaller so that one parallel channel occurs per charge storage/transfer site of the series input register and/or the series output register. The information density or quantity of information can thus be substantially doubled. Because only half of the site of the series channels can be occupied simultaneously, the information can no longer be read in or read out per column. Therefore, upon reading in, for example, first the even sites of a row are occupied with information and then, in a second step, the odd sites (interlacing). Analogously, when reading out a row, first the charge packets, for example, on the even sites are introduced and read out in the series output channel and then the information in the odd sites (de-interlacing) are introduced and read out.

The electrode system configuration at the parallel-to-series transition which as specified in the above comprises two interdigitated combs is known inter alia from the already-mentioned U.S. Pat. No. 3,967,254, and serves for de-interlacing the stored information. Its operation thereof is basically as follows: first a complete row of signal charges is moved below the said first comb-shaped electrode. The signals then alternate below a tooth and below a region below the cross-bar of the comb-shaped electrode. By means of the said first control electrode, the signals which are stored below the teeth of the first comb-shaped electrode can be moved via the regions below the cross-bar below the second comb-shaped electrode into the series-output register channel so as to be read out at the output. During this parallel-series transfer the signals, which are stored below the cross-bar of the first comb-shaped electrode, are not transferred since the first control electrode overlaps only the teeth and not the cross-bar of the first comb-shaped electrode. When the series output channel is again empty, the remaining signals can be moved below the teeth of the second comb-shaped electrode by means of the second control electrode and then again into the series-output channel.

In the last-mentioned transport, in which the charge is moved from below the teeth into the series-output channel, the electrode structure may give rise to problems. In case of small quantities of charge the charge transfer consists substantially of thermal diffusion in which the charge (on the source side) moves asymptotically to zero along an exponential curve as a function of the time t with a time constant $\tau = 4L^2 \cdot (\pi^2 D)^{-1}$. In this formula L is the length of the electrode on the source side and D is the diffusion constant. Because the length L of the teeth generally is large, the charge transport will be rather inert. In a specific embodiment in which L at the area of the teeth is more than twice as large as the cross-bars of the comb-shaped electrodes (and, the lengths L of the remaining clock electrodes), the time constant T becomes more than 4 times as large.

The comb-configuration of the de-interlacing electrodes therefore has a detrimental influence on the frequency properties of the memory, in particular in those cases in which the further dimensions are chosen to be as small as possible.

SUMMARY OF THE INVENTION

One of the objects of the invention is to mitigate this disadvantage at least for the greater part and it is inter alia based on the recognition of the fact that loss of time can be prevented by causing the slow charge transport to take place at least substantially in the time interval in which the first sub-row of the series-output channel is transported.

According to the invention, a charge-coupled device having the features specified above is characterized in that a third strip-shaped control electrode is provided between the said electrode system and the channel of the series output register, extends transversely across the parallel channels and forms with the underlying parts of the parallel channels and forms with the underlying parts of the parallel channels a plurality of buffer storage sites in which, when a first sub-row of a row of charge packets is introduced into the series output register channel, the other sub-row can be stored before being introduced into the series output register channel when the series-output register channel is again empty.

As a result of the presence of the buffer electrode between the comb-shaped electrode structure and the series-output register channel, the slow charge transport may take place in the read-out time of the first sub-row. As a result of the comparatively long duration of said read-out time, said charge transport does not present any problems. Since the electrode length of the buffer electrode may be very small (it may at least be made much smaller than the length of the teeth) the transfer from the buffer electrode to the series output channel may be very fast. In a preferred embodiment in which the length L of the buffer is at least approximately two times smaller than the length L of the teeth, the charge transport may be approximately four times faster as a result of which the frequency properties of the parallel-series junction again become comparable to those in other parts of the memory.

BRIEF DESCRIPTION OF THE DRAWING

An embodiment of the invention will now be described by way of example with reference to the accompanying diagrammatic drawing, in which.

It is to be noted that the Figures are diagrammatic and are not drawn to scale.

DESCRIPTION OF THE PREFERRED EMBODIMENTS

Figure 1:
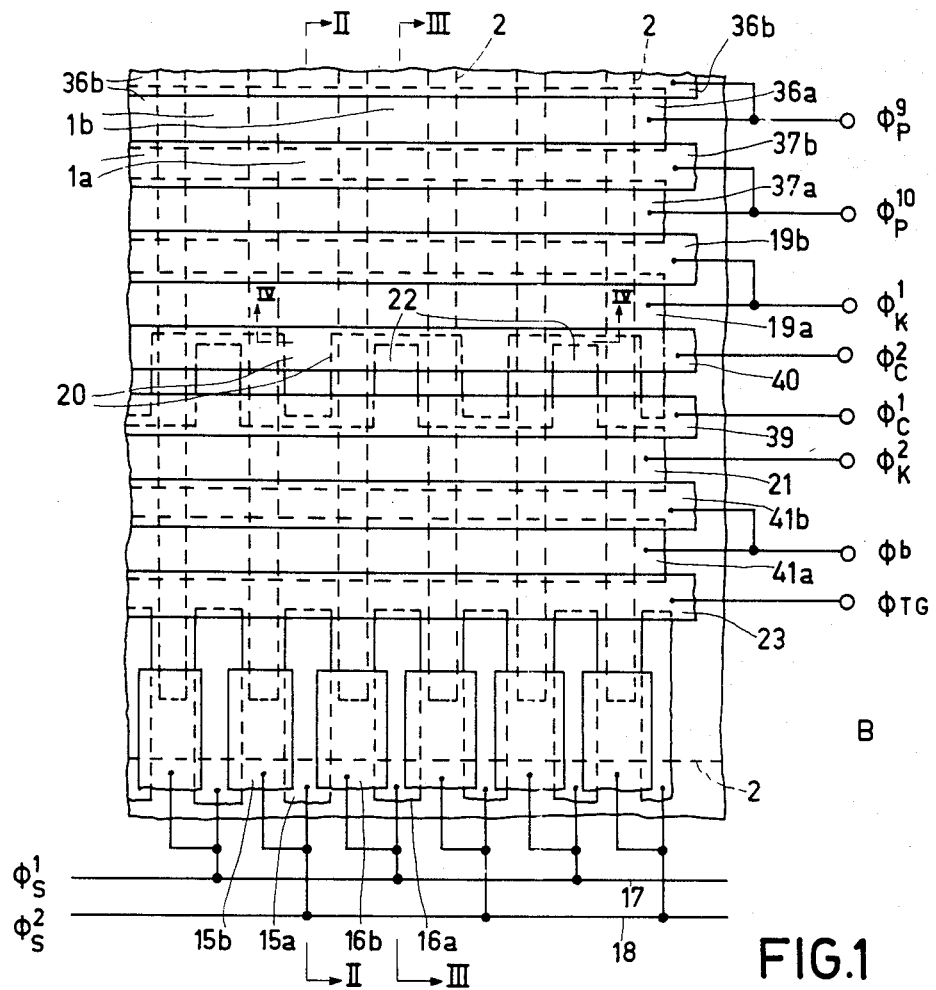
FIG. 1 is a plan view of a part of a semiconductor device in accordance with the invention.
Figure 6:
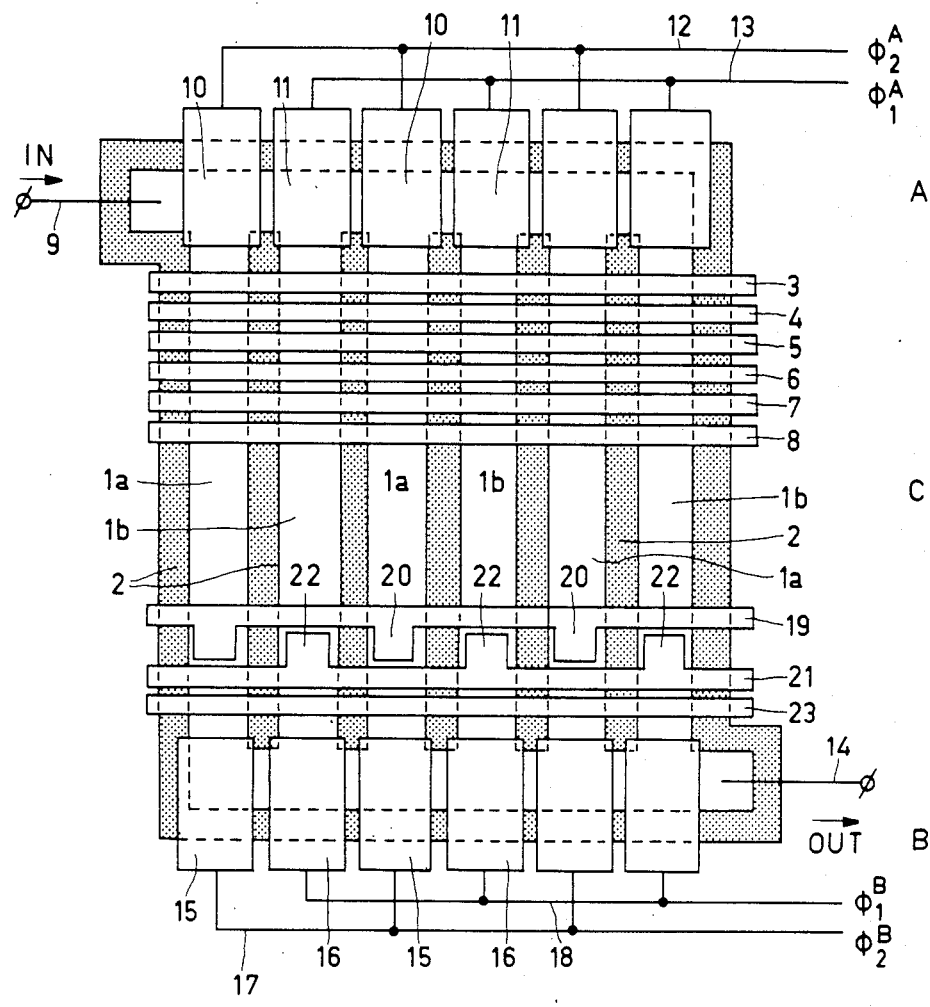
FIG. 6 shows a diagram of an SPS-memory.

Although the invention is not restricted to SPS-memories but may also be used in other matrix-like structures, it will be described specifically with reference to an SPS-memory due to the particular interest of the invention for this class of devices. For that purpose, FIG. 6 shows a diagram of an SPS-memory device. The device comprises a series-input register A, a series-output register B and a parallel section C which is present between the registers A and B and which forms the actual memory matrix. The parallel section comprises a number of juxtaposed channels 1 of which only six are shown in FIG. 1 but of which the actual number will be much larger and may be a few hundred. The direction of the charge-transport in the channels 1 is considered to be from the top to the bottom in the drawing. Channel stopper regions 2 are formed between the channels 1 and isolate the channels 1 from each other. The charge transport in the parallel section is controlled by clock electrodes 3 to 8 extending transversely across the parallel section. The electrode 3 constitutes a transfer gate for transferring information from the series-input register A to the parallel section C. The electrodes 4 to 8 constitute a number of memory sites arranged in a matrix structure with the underlying semiconductor body. The electrodes 4 to 8 may form a 2, 3 or 4-phase system. Preferably, however, said clock electrodes are arranged to form a so-called multiphase system in, for example, groups of 10. As described inter alia in U.K. Patent Application No. 8224939, which corresponds to Dutch Application No. 8104102, nine out of ten successive storage sites in each group are filled with information, while the tenth remains empty. By moving the empty place from the top to the bottom the information can be moved from the top to the bottom step by step. The advantage of this mode of operation is the high information density which can be obtained in the parallel section in that only one empty site occurs in every ten sites.

It is to be noted that only a few clock electrodes of the parallel section are shown but that, of course, the whole memory matrix is covered with such electrodes.

The series-input register A comprises a 2-phase CCD ahving an input connection 9 for supplying the information to be stored in the memory, and clock electrodes 10 and 11. For simplicity, said electrodes are shown in FIG. 6 by single electrodes connected to one of the clock lines $\phi_1$ and $\phi_2$. In practice, however, the electrodes are often composed of two parts which are electrically connected together at different metallization levels, as will be described hereinafter in the following embodiment. The register A forms a 2-phase CCD in which the electrodes 10 are connected, via the common clock line 12, to the clock voltage source $\phi_2{}^A$ and the electrodes 11 are connected to the clock voltage source $\phi_1{}^A$ via the clock line 13.

The output register B is likewise formed by a 2-phase CCD having an output contact 14 and electrodes 15 and 16 which are connected alternately via the clock lines 17 and 18, respectively, to 2-phase clock voltages $\phi_1{}^B$, $\phi_2{}^B$.

It is assumed that an asymmetry is provided below the electrodes 10, 11 and 15, 16, respectively, in such manner that upon applying clock voltages below the lefthand edges of the electrodes a potential barrier is formed as a result of which a 2-phase charge transport is effected from the left to the right. Such a known asymmetry may also be provided below the electrodes 4–8 in the parallel section.

In the FIG. 6 SPS-memory the pitch between the parallel channels 1 is chosen such that one parallel channel of the parallel section C corresponds to each stage (electrode) of the series registers A and B. In this manner a maximum information density can be obtained. Because, however, in the horizontal registers information can be stored only in every other electrode (in the 2-phase CCD the full sites are always alternated by an empty site) the writing or reading of a row of information does not take place in one time but in two successive steps. Upon writing, for example, first the sites below the electrodes 10 in the series input register A are filled. Via the transfer gate those signals are transferred below the first electrode 4 in the channels 1a. The input register A is then filled again with signals until all sites below the electrodes 11 are occupied; the signals introduced in the first step meanwhile remain below the electrode 4. The signals below the electrode 11 are then moved from the input register A in the parallel channels 1b below electrode 4 (interlacing). Now a complete row below the electrode 4 is filled with information which can be transported to the output register B in the usual CCD-manner in the form of a row.

Because the output register B as well as the input register A can hold at most only half a row, the signals of a row must be moved in the register in two successive steps to be read out. In FIG. 6 the electrode configuration for dividing the rows is shown diagrammatically and, for clarity, only partly. Viewed in the direction of charge transport said electrode configuration comprises a first comb-shaped electrode 19 having teeth 20 above the channels 1a, and a second comb-shaped electrode 21 having teeth 22 above the channels 1b. Two control or transfer gates are present above the combs which are not shown to avoid complexity of the drawing but one of which extends above the tips of the teeth 20 and the other of which extends above the teeth 22, as will become apparent from the description of the embodiment of FIGS. 1 to 4. A transfer gate 23 is present between the comb 21 and the series output register B.

A row of charge packets which is moved through the parallel section from the top to the bottom can be stored below the first comb 19. The charge packets below the teeth 20 in the channels 1a can then be further transported selectively to the read-out register B, while the charge packets remain in the channels 1b. When the read-out register B is again empty, the charge packets in the channels 1b can be transferred.

FIGS. 1 to 4 are a plan view and cross-sectional views, respectively, of a part of an embodiment of an SPS-memory according to the invention, namely a part which comprises the transition between the parallel section C and the output register B. It is to be noted that the same reference numerals as in FIG. 6 will be used as much as possible for corresponding components. In addition it is to be noted that, although the embodiment is of the n-type surface channel type, the invention is not restricted hereto, but may also be used in constructions having a p-type channel and/or in constructions of the buried channel type.

The device comprises a p-type semiconductor body 31, preferably of silicon. Of course, any other suitable semiconductor material may be used instead of silicon. The semiconductor body 1 comprises at least a surface layer 32 having a comparatively low doping concentration of between $10^{15}$ and $10^{16}$ acceptor atoms per cm$^3$. This layer may cover the whole thickness of the semiconductor body but in another important embodiment it may also be provided as a comparatively high-ohmic layer having a thickness between 5 and 10 $\mu$m on a low-ohmic p-type substrate 33 having a doping concentration between $10^{19}$ and $10^{20}$ atoms per cm$^3$. As is known, this construction of the semiconductor body has the advantage that the leakage currents can be restricted. in FIGS. 2 to 4 this possible composition is indicated by the broken lines separating the epitaxial layer 32 from the substrate 33.

The CCD channels 1a and 1b of the parallel section C and the channel of the output register B are defined in the p-layer 32 as well as the input register A not shown in the Figures. For this purpose, the surface of the semiconductor body has a field oxide pattern 2 (shown in broken lines in FIG. 1) which covers a large part of the surface and has openings at the area of the channels 1a, 1b, A and B. Of course, the field oxide pattern 2 may also have openings outside the part shown in the Figures in places where peripheral circuits are provided. The field oxide pattern 2, the thickness of which may be between 0.5 and 1 $\mu$m, is formed in the present embodiment by means of local oxidation of the silicon body. In order to prevent stray channel formation, the doping concentration below the oxide pattern 2 is increased by providing the p-type channel stopper zones 34.

The width of the channels 1a, 1b is, for example, approximately 5 $\mu$m, while the width of the field oxide strips 2 which separate the channels 1a and 1b from each other is approximately 2 $\mu$m.

At the area of the CCD-channels the surface of the semiconductor body is covered with a thin dielectric layer, for example with a silicon oxide layer 35 with a thickness between 0.05 and 0.07 $\mu$m. The clock electrodes in the form of a two-layer wiring are provided on the layer 35. The electrodes 15, 16 of the output register B each comprise an electrode portion 15a and 16a, respectively, of polycrystalline silicon (hereinafter referred to as poly) and a portion 15b and 16b, respectively, of, for example, A1 (or optionally also poly). The portions 15a, 15b and 16a, 16b, respectively, as shown in FIG. 1, may be connected together outside the part shown in the Figures. The doping concentration of acceptor atoms below the portions 15b, 16b can be increased by an extra p-type implantation in a known self-registering manner with respect to the poly strips 15a, 16a, so as to obtain a potential barrier for 2-phase operation. As shown in the Figure each pair 15a, 15b and each pair 16a, 16b corresponds in width with the width of a channel 1a and 1b, respectively (including the field oxide strips 2).

The clock electrodes 15a, 15b and 16b are connected to clock lines 17 and 18, respectively, for supplying the clock voltage $\phi_s^1$ and $\phi_s^2$.

Two of the clock voltage electrodes of the parallel section are shown in the drawing, namely the electrodes 36 and 37, which are connected to the clock voltage sources $\phi_p^9$ and $\phi_p^{10}$ of the 10-phase clock system. The electrodes 36 and 37 comprise a poly strip 36a and 37a, respectively, forming the storage parts of the electrodes, and A1 (or poly) strips 36b and 37b, respectively, which define the transfer regions and are short-circuited outside the Figures to the parts 36a and 37a, respectively. In the same manner as in the series registers A, B, an extra p-type implantation (38) is carried out below the parts 36b, 37b so as to obtain a potential barrier and hence the desired direction in the charge transport. The first comb-shaped electrode 19 comprises a part 19a which is constructed in the lower most wiring layer, the polycrystalline silicon layer, and a part 19b which is present between said part 19a and the last clock electrode 37 and which is constructed in the A1-wiring layer and which is short-circuited to the part 19a. A p-type implantation is again provided below the electrode part 19b so as to obtain a potential barrier.

The second comb-shaped electrode 21 is constructed in the lowermost layer, the poly-wiring layer.

Figure 2:
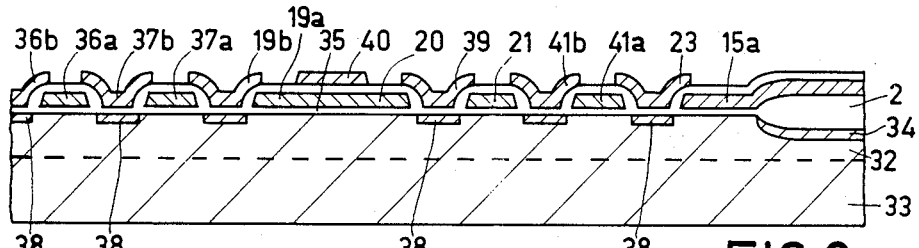
FIGS. 2 to 4 are sectional views of the device as shown in FIG. 1 taken on the lines II—II, III—III, and IV—IV, respectively.
Figure 3:
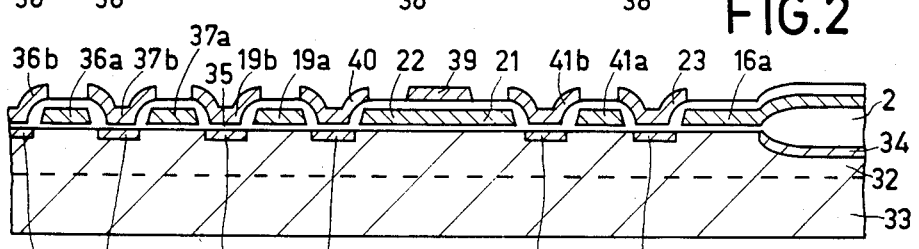
Figure 4:
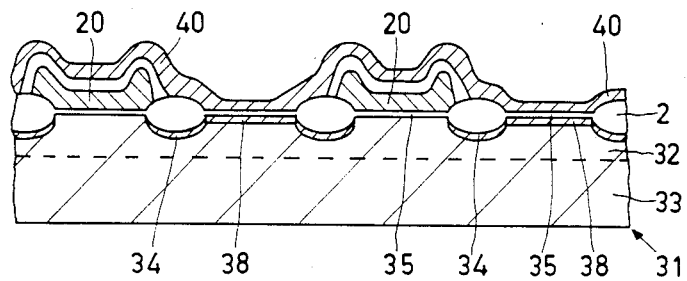

The teeth 20 of the comb 19 extend above the channels 1a, the teeth 22 of the comb 21 extend above the channels 1b of the parallel section. The control electrode 39 is present above the intermediate space between the teeth 20 of the comb 19 on the one hand and the comb 21 on the other hand; the control electrode 40 is provided above the intermediate space between the teeth 22 of the comb 21 on the one hand and the comb 19 on the other hand. As shown in FIGS. 2 to 4, a p-type implanted zone 38 may be provided in the said intermediate spaces so as to obtain the desired surface potential upon applying clock voltages of the same voltage values as the other clock voltages to be applied.

The transfer gate 23 also shown in FIG. 6 and constructed in the A1 wiring layer is present before the output register B. A p-type zone 38 is also provided below said transfer gate so as to obtain the desired surface potential.

In accordance with the invention, an extra electrode 41 is provided between the transfer gate 23 and the second comb-shaped electrode 21. This extra electrode is built up, in the same manner as the electrodes 36, 37, from two parts, one part 41a constructed in poly-Si which defines a storage site in the semiconductor body, and one part constructed in A1 which together with the underlying p-type implanted zone defines a transfer region. The electrode 41 forms buffer sites in which charge packets can be stored temporarily before being transferred to the series output register B which is not yet empty. As a result of this the influence of delays which might occur during this transport of charge packets between the teeth 22 and the series-out register B can be eliminated. For this purpose the width of the buffer electrode 41, or at least of the part 41a which defines the storage part in the semiconductor body, can be chosen to be much smaller than the length of the teeth 20, 22 and may be approximately the same (for example to within ±25%) as the length of the cross-bar of the second comb-shaped electrode. In a specific embodiment the width of strip 41a was approximately 5 μm, as well as the width of the strips 36 and 37 and the width of the cross-bar portions of the comb-shaped electrodes 19, 21. The length of the teeth of the comb 19, 21 in this embodiment was approximately 12 μm. According to the already mentioned equation $\tau=4L^2 \cdot (\pi^2 D)^{-1}$, according to which $\pi$ is proportional to the square of L, this resulted in charge transfer times of approximately 20 n.sec. at L=5 μm, and of approximately 100 n.sec. at L approximately equal to 12 μm.

Figure 5:
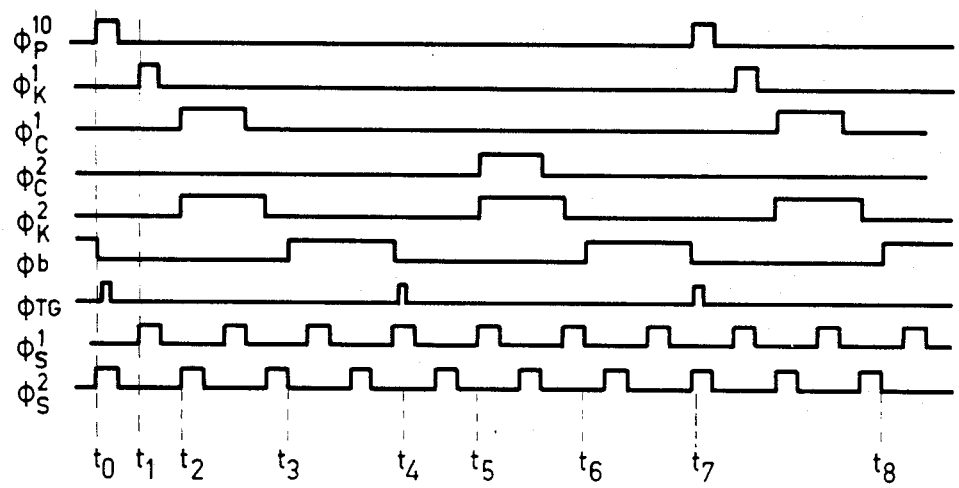
FIG. 5 shows a diagram of clock voltages to be applied.

In order to explain the effect achieved by means of the invention, FIG. 5 shows a diagram of clock voltages with which the device is operated. It is assumed that the parallel section C is operated with a 10-phase ripple clock and that the clock voltage $\phi_p^{10}$ is applied to the last electrode of the parallel section situated before the comb electrode 19, 20. Of course, one of the other 10-phase clock voltages may be applied to the last electrode. The length of the parallel section is not relevant but may be a few hundred storage sites. The width of the parallel section is, for example, 256 channels so that the length of the series channels, which must be capable to comprise at least 128 charge packets, is also at least 256 storage sites. In FIG. 5, each time only seven pulses are shown of the series output register clocks $\phi_s^1$ and $\phi_s^2$ to read-out half a row, but it will be apparent that in order to read out half a row, 128 bits, 256 pulses are necessary. It is further assumed that the clock voltage levels vary between 0 and 5 Volts at a substrate voltage of, for example, −2.5 Volts. At these voltages a signal (packet of electrons) is transferred from a first electrode to a second electrode when at a voltage of 0 Volt at the first electrode the value of 5 V is applied to the second electrode (drop clocking). When the second electrode then returns to 0 V again, the electrons remain below the second electrode.

At the voltages shown in FIG. 5 the operation is as follows:

At $t_0$ a row of information comes below the last electrode in the parallel section connected to $\phi_p^{10}$. At the instant t1 said row is transferred by the pulse $\phi_k^1$ below the first comb-shaped electrode 19. The charge packets are stored alternately below the teeth 20 and below the narrow parts of the electrode 19 between the teeth. As a result of the pulses $\phi_c^1$ and $\phi_K^2$ on the first control electrode 39 and the comb 21, the packets stored below the teeth 20 in the channels 1a are transferred to the second comb-shaped electrode 21 at t2. The packets which are stored in the channels 1b below the first comb-shaped electrode are not transferred due to the voltage 0 V at the second control electrode 40. At t3 the transferred 128 bits are further transported to the buffer electrode 41 by the pulse $\phi_b$. When the series-output register B is empty, said half row can be moved in the series output register B by applying the pulse $\phi_{1g}$ to the transfer gate 23 and simultaneously applying the voltage of 5 V to the electrodes 15a, 15b. By means of the clocks $\phi_s^1$ and $\phi_s^3$ the 128 bits (half a row) can be transported through the series-output register B to the output of the device, until at t7 all charge packets have been read out and the register B is empty again. Meantime the remaining half row, i.e. the charge packets below the first comb 19 in the channels 1b, can be further transported by the pulse $\phi_K^2$ on the second comb 21, 22 and the pulse $\phi_c^2$ on the second control electrode. These charge packets can be transferred directly to the buffer gate 41 by the pulse $\phi_b(t6)$. As a result of the comparatively large length of the teeth 22 the time constant of said charge transport is large. Due to the presence of the buffer gate 41, this comparatively inert charge transport can take place in the time interval t6–t7 in which the first half row is still being read-out so that nevertheless no delays are introduced in the device with the inert charge transport. When the series register is empty (t7) the second half row of 128 bits can be moved below the electrodes 16 in the series-output register by the pulse $\phi_{TG}$. As a result of the small width of the electrode 40 this charge transport can occur very rapidly. The series-output register B is then filled again entirely and can be operated again in the usual manner. While these 128 bits are read-out again, the first half sub-row of a subsequent row of information, i.e. the bits of said row, can be transported below the teeth 20 and then to the narrow parts of the second comb between the teeth and from here to the buffer 40. This latter charge transport can occur rapidly so that now a short pulse on electrode 40 might suffice (t8). In this example, however, the pulse $\phi_b$ at t8 has been chosen to be as long as the pulse $\phi_b$ at t7 so as to simplify the clock control.

It will be apparent that the invention is not restricted to the example described, but that many variations are possible to those skilled in the art without departing from the scope of this invention. For example, in the embodiment described the sequence of the sub-rows may be reversed, so that from a whole row of information first the charge packets in the channels 1b and then the charge packets in the channels 1a are transferred to the output register B.

Furthermore, the invention may be used in matrixlike structures other than SPS-memories, for example in image sensors.

What is claimed is:

1. A charge-coupled device comprising, at a surface of a semiconductor body, a system of juxtaposed parallel channels and a series output register of which successive charge storage and transfer elements are each associated with a parallel channel, which system of parallel channels comprises two sub-groups so arranged that the parallel channels being alternately to a first sub-group and to a second sub-group, and in which there is provided at the area of transition from the parallel channels to the series output register an electrode system by means of which a row of charge packets transported through the parallel channels can be divided into two sub-rows which correspond to the two sub-groups and which can be introduced successively into the series output register, said electrode system comprising first and second comb-shaped electrodes and first and second strip-shaped control electrodes, the first comb-shaped electrode having a cross-bar in the form of a strip extending transversely across the parallel channels and having teeth which extend from the cross-bar in the direction of charge transport above the parallel channels of the first sub-group, the second comb-shaped electrode having a cross-bar which, near the tips of the teeth of the first comb-shaped electrode, extends transversely across the parallel channels and has teeth which are interdigitated with the teeth of the first comb-shaped electrode and extend above the parallel channels of the second sub-group in the proximity of the strip-shaped cross-bar of the first comb-shaped electrode, the first and second strip-shaped control electrodes extending transversely across the parallel channels and, viewed perpendicular to the surface, being present in the regions between the tips of the first comb-shaped electrode and the cross-bar of the second comb-shaped electrode, and in the regions between the tips of the second comb-shaped electrode and the cross-bar of the first comb-shaped electrode, respectively, characterized in that a third strip-shaped control electrode is provided between said electrode system and the channel of the series output register, extends transversely across the parallel channels of said first and second sub-groups, each of said parallel channels of said first and second sub-groups extending to said series output register and being separately coupled thereto, and forms with the underlying parts of the parallel channels a plurality of buffer storage sites in which, when a first sub-row of a row of charge packets is introduced into the series output register channel, the other sub-row can be stored before being introduced into the series output register channel when the series output register channel is empty again, and transfer gate means between the third control electrode and the series output register for transferring charge packets stored below said third control electrode to said series output register.

2. A charge-coupled device as claimed in claim 1, characterized in that, viewed in the direction of charge transport, the effective length of the third control electrode is smaller than the effective length of the teeth of the comb-shaped electrodes.

3. A charge-coupled device as claimed in claim 2, characterized in that, viewed in the direction of charge transport, the length of the third control electrode is approximately the same as the length of the cross-bar of the second comb-shaped electrode.

4. A charge-coupled device as claimed in claim 1, characterized in that the parallel channels form a parallel section of a series-parallel-series memory, the inputs of the parallel channels being coupled to a second series channel which forms the series input register of the memory.

5. A charge-coupled device as in claim 1, further comprising means for supplying clock voltages to said third strip-shaped control electrode, and wherein the width in the direction of charge transport of that portion of said third strip-shaped control electrode which defines said buffer storage sites is substantially smaller than the length of said teeth extending in the direction of charge transport, such that said other sub-row of charge packets is stored in said buffer storage sites before said first sub-row of charge packets has been fully removed from said series output register.

* * * * *